United States Patent
Klass

(10) Patent No.: US 9,973,191 B2
(45) Date of Patent: May 15, 2018

(54) POWER SAVING WITH DUAL-RAIL SUPPLY VOLTAGE SCHEME

(71) Applicant: Apple Inc., Cupertino, CA (US)

(72) Inventor: Edgardo F. Klass, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days. days.

(21) Appl. No.: 15/201,739

(22) Filed: Jul. 5, 2016

(65) Prior Publication Data
US 2018/0013432 A1    Jan. 11, 2018

(51) Int. Cl.
H03K 19/00 (2006.01)
G06F 1/10 (2006.01)
H03K 19/0185 (2006.01)
H03K 19/177 (2006.01)

(52) U.S. Cl.
CPC ........... *H03K 19/0016* (2013.01); *G06F 1/10* (2013.01); *H03K 19/018521* (2013.01); *H03K 19/17784* (2013.01)

(58) Field of Classification Search
CPC ....... H03K 19/0016; H03K 19/018521; H03K 19/17784; G06F 1/10
USPC ...................... 326/83, 93; 327/297, 141, 295
See application file for complete search history.

(56) References Cited

U.S. PATENT DOCUMENTS

| | | | | |
|---|---|---|---|---|
| 6,525,587 | B2 * | 2/2003 | Makino | G06F 1/10 327/143 |
| 2006/0170480 | A1 * | 8/2006 | Chiu | G06F 1/32 327/297 |
| 2015/0177824 | A1 | 6/2015 | Ganule et al. | |

FOREIGN PATENT DOCUMENTS

| | | |
|---|---|---|
| CN | 104320125 A | 1/2015 |
| JP | 2007335600 A | 12/2007 |

OTHER PUBLICATIONS

Farhad Haj Ali Asgari and Manoj Sachdev; A Low-Power Reduced Swing Global Clocking Methodology; IEEE Transactions on Very Large Scale Integration (VLSI) Systems, vol. 12, No. 5, May 2004, 1063-8210/04; 8 pages.

(Continued)

*Primary Examiner* — Daniel D Chang
(74) *Attorney, Agent, or Firm* — Meyertons, Hood, Kivlin, Kowert & Goetzel, P.C.; Lawrence J. Merkel

(57) ABSTRACT

In an embodiment, an integrated circuit includes a clock tree circuit and logic circuitry that is clocked by the clocks received from the clock tree circuit. The logic circuit is powered by a first power supply voltage. The integrated circuit includes a voltage regulator that receives the first power supply voltage and generates a second power supply voltage having a magnitude that is lower than the magnitude of the first power supply voltage by a predetermined amount. The second power supply voltage may track the first power supply voltage over dynamic changes during use, either intentional changes to operating state or noise-induced changes. The second power supply voltage may be used to power at least a portion of the clock tree.

20 Claims, 4 Drawing Sheets

(56) References Cited

OTHER PUBLICATIONS

Jatuchai Pangjun and Sachin S. Sapatnekar, Department of Electrical and Computer Engineering, University of Minnesota, Minneapolis, MN 55455, Low Power Clock Distribution Using Multiple Voltages and Reduced Swings; SRC,contract 98-DJ-609, NSF,award CCR-9800992, Royal Thai Air Force; IEEE Transactions on Very Large Scale Integration (VLSI) Systems (vol. 10 , Issue: 3 ); pp. 309-318; Date of Publication: Jun. 2002; 18 pages.
SR/WO PCT/US2017/039423, dated Aug. 23, 2017, 20 pages.
Machine Translation of CN Patent Application 104320125 A, 10 pages, dated Aug. 23, 2017.
Machine Translation of JP2007335600A, 6 pages, dated Aug. 23, 2017.

\* cited by examiner

POWER SAVING WITH DUAL-RAIL SUPPLY VOLTAGE SCHEME

BACKGROUND

Technical Field

Embodiments described herein are related to power management in integrated circuits.

Description of the Related Art

Integrated circuits are often included in various mobile devices, which are frequently operated on a limited power source such as a battery. In other cases, integrated circuits may be incorporated into devices with limited ability to remove thermal energy (heat). In devices like these, conserving power is a key design feature for the integrated circuits.

Digital integrated circuits include one or more clocks to control transitions in the integrated circuit, to cause storage devices such as latches, flops, registers, memory arrays, etc. to capture and launch data, etc. Distributing the clock over the semiconductor area occupied by the integrated circuit is challenging. At the high clock frequencies employed within many integrated circuits, the clock tree needs to be as balanced as possible, matching line lengths, loads, and delays from the clock source to the receiving circuitry. Fanout and load of the clock signals, and similarity of the buffering chains, is managed closely. If these parameters are not carefully managed, clock skew and jitter may be high, reducing the performance of the integrated circuit. These factors tend to lead to large and complex clock propagation networks, or clock trees, which consume a significant amount of power. The power consumption is significant both because of the size and load of the clock tree, but also because the clock is toggling every clock cycle during operation. In some cases, clock power may be as much as 50% or more of the overall power consumption in an integrated circuit.

SUMMARY

In an embodiment, an integrated circuit includes a clock tree circuit and logic circuitry that is clocked by the clocks received from the clock tree circuit. The logic circuit is powered by a first power supply voltage. The integrated circuit includes a voltage regulator that receives the first power supply voltage and generates a second power supply voltage having a magnitude that is lower than the magnitude of the first power supply voltage by a predetermined amount. The voltage regulator may maintain a fixed relationship between the magnitude of the first power supply voltage and the second power supply voltage, for example. The second power supply voltage may track the first power supply voltage over dynamic changes during use, either intentional changes to operating state or transient noise-induced changes. The second power supply voltage may be used to power at least a portion of the clock tree. Because the voltage is lower, the power consumed in the clock tree is lower. However, because the second supply voltage tracks the first power supply voltage, the clock skew and jitter may be low even when there is variation or intentional change in the power supply voltage magnitudes.

BRIEF DESCRIPTION OF THE DRAWINGS

The following detailed description makes reference to the accompanying drawings, which are now briefly described.

Figure 1:
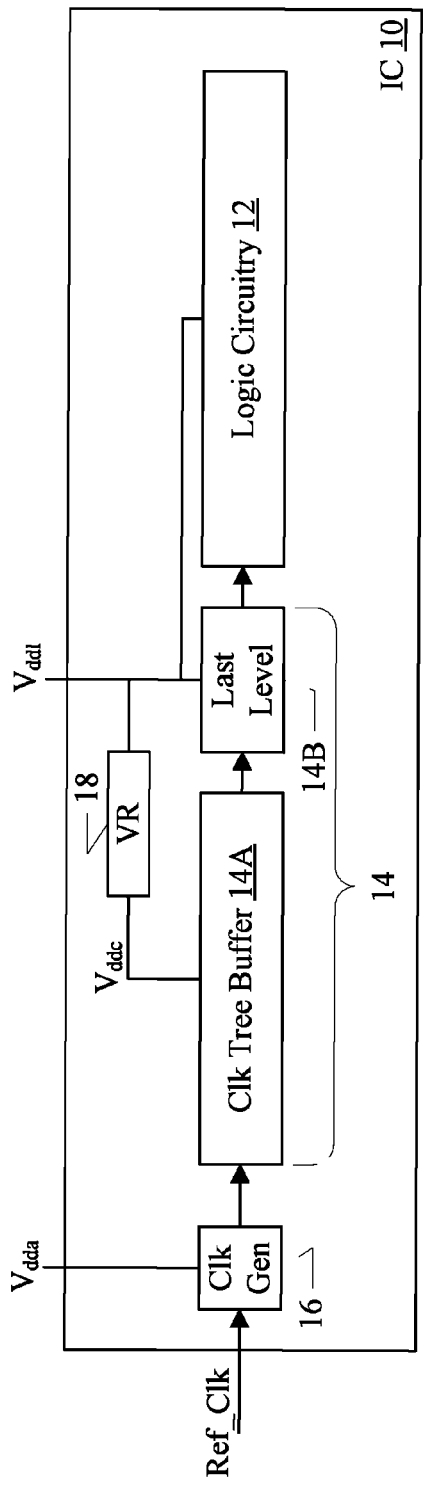
FIG. 1 is a block diagram of one embodiment of an integrated circuit.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "clock circuit configured to generate an output clock signal" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible. In general, the circuitry that forms the structure corresponding to "configured to" may include hardware circuits. The hardware circuits may include any combination of combinatorial logic circuitry, clocked storage devices such as flops, registers, latches, etc., finite state machines, memory such as static random access memory or embedded dynamic random access memory, custom designed circuitry, analog circuitry, programmable logic arrays, etc. Similarly, various units/circuits/components may be described as performing a task or tasks, for convenience in the description. Such descriptions should be interpreted as including the phrase "configured to."

The term "configured to" is not intended to mean "configurable to." An unprogrammed FPGA, for example, would not be considered to be "configured to" perform some specific function, although it may be "configurable to" perform that function. After appropriate programming, the FPGA may then be configured to perform that function.

Reciting in the appended claims a unit/circuit/component or other structure that is configured to perform one or more tasks is expressly intended not to invoke 35 U.S.C. §112(f) interpretation for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

In an embodiment, hardware circuits in accordance with this disclosure may be implemented by coding the description of the circuit in a hardware description language (HDL) such as Verilog or VHDL. The HDL description may be synthesized against a library of cells designed for a given integrated circuit fabrication technology, and may be modified for timing, power, and other reasons to result in a final design database that may be transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and may further include other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA.

As used herein, the term "based on" or "dependent on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

DETAILED DESCRIPTION OF EMBODIMENTS

FIG. 1 is a block diagram of one embodiment of an integrated circuit (IC) 10. In the illustrated embodiment, the IC 10 includes logic circuitry 12, a clock tree circuit 14, a clock generator circuit 16, and an on-chip voltage regulator 18. The clock tree circuit 14 includes clock tree buffer circuit 14A and a last level circuit 14B. The clock generator circuit 16 is coupled to an input of the IC 10 on which a reference clock (Ref_Clk in FIG. 1) is received, and is coupled to the clock tree circuit 14 (and more particularly to the clock tree buffer circuit 14A). The clock tree buffer circuit 14A is coupled to the last level circuit 14B, which is further coupled to the logic circuitry 12. The IC 10 includes power supply inputs for a first supply voltage ($V_{dda}$) and a second supply voltage ($V_{ddl}$). The clock generator circuit 16 is powered by the $V_{dda}$ supply voltage during use, and the last level circuit 14B, the voltage regulator 18, and the logic circuitry 12 are powered by the $V_{ddl}$ supply voltage during use. The voltage regulator 18 is configured to generate a third supply voltage ($V_{ddc}$) that powers the clock tree buffer circuit 14A during use.

The voltage regulator 18 may be configured to generate the $V_{ddc}$ voltage from the $V_{ddl}$ voltage such that the $V_{ddc}$ voltage may have a fixed relationship to the $V_{ddl}$ voltage, tracking the voltage with the desired difference. Specifically, the magnitude of the $V_{ddc}$ voltage may be less than the magnitude of the $V_{ddl}$ voltage by a specified amount. For example, the $V_{ddc}$ voltage magnitude may be a predetermined offset from the $V_{ddl}$ voltage (e.g. an offset in the range of 0.3 to 0.7 volts may be used in various embodiments). In another embodiment, the $V_{ddc}$ voltage magnitude may be a predetermined percentage of the $V_{ddl}$ voltage magnitude. For example, 50% to 80% may be a range for various embodiments. In one particular embodiment, the $V_{ddc}$ voltage magnitude may be about 70% of the $V_{ddl}$ voltage magnitude.

By reducing the voltage magnitude to most of the clock tree circuit 14, the power consumed in distributing the clock from the clock source to the logic circuitry 12 may be reduced. Since power consumption in the clock tree circuit 14 may be a significant component of the power consumption in IC 10, the power savings in the clock tree circuit 14 may result in significant power savings overall for the IC 10. The last level of buffering (that is, the buffers that are connected to the clock inputs to the logic circuitry 12) may be powered by the $V_{ddl}$ voltage and may level shift the lower voltage clock to the full $V_{ddl}$ voltage. Providing the clocks at the same voltage level as the logic circuitry 12 may ensure that the transistors in the logic circuitry 12 are fully switched on and off in operation, avoiding excess leakage current in the transistors that are logically "off" in response to a given level of the clock signal.

Because the voltage regulator 18 uses the $V_{ddl}$ voltage to generate the $V_{ddc}$ voltage, the $V_{ddc}$ voltage may closely track the $V_{ddl}$ voltage during use. In some embodiments, the IC 10 may operate over a wide range of voltages that may be dynamically changed during use. With the $V_{ddc}$ voltage dependent on the $V_{ddl}$ voltage, the changes in the $V_{ddl}$ voltage may be reflected naturally in the $V_{ddc}$ voltage. Even changes due to noise, load changes, etc. on the $V_{ddl}$ voltage may be reflected in the $V_{ddc}$ voltage. On the other hand, independently-generated voltages may change at different rates when being dynamically modified during use, which may cause jitter and clock skew in the clock tree circuit 145 to be increased. The voltage regulator 18 may be configured to minimize the jitter and skew aspects of the clock signals even during periods of dynamic voltage modification. Low jitter and skew is critical to high performance ICs that may operate at high frequencies.

The voltage regulator 18 may include any circuitry that is configured to receive an input voltage and generate an output voltage in response. The output voltage is regulated by the voltage regulator in an attempt to produce a constant voltage magnitude under varying load conditions. The voltage regulator 18 may include various energy storage components such as combinations of inductors and capacitors to store energy from the input voltage to be provided to the receiving circuits (e.g. the clock tree buffer circuit 14A) to ensure that the output voltage is maintained. Various embodiments of the voltage regulator 18 may include any analog or digital linear regulator. For example, low drop out (LDO) voltage regulator may be used. Buck voltage regulators may be used, or switched capacitor regulators. A voltage regulator 18 may include one or more analog or digital voltage comparators (e.g. op amps comparing to a reference voltage) that control one or more transistors that supply current on a supply voltage node such as $V_{ddc}$ or $V_{ddl}$, in some embodiments.

The clock tree circuit 14 may generally include the circuitry configured to receive a source clock and distribute the clock to multiple clock sinks, with an attempt to match the delay and load to each sink to minimize the difference in time at which the clock arrives (e.g. skew and jitter). The clock sinks may be, e.g., various clocked storage devices and other clocked elements in the logic circuitry 12. Thus, while the clock tree circuit 14 is shown in between the clock generator circuit 16 and the logic circuitry 12, the clock tree circuit 14 may generally be distributed over the area occupied by the logic circuitry 12, and may deliver the clock to multiple physically distributed points within the area.

The logic circuitry 12 may include any combinatorial logic and clocked storage circuits such as latches, flops, registers, memory arrays, etc. The clocks provided by the clock tree circuit 14 may be received by the clocked storage circuits and/or any other circuitry that may use a clock (e.g. dynamic logic circuitry). Each connection point to the clock tree circuit 14 may be a clock sink.

The clock generator circuit 16 may include any clock generation circuitry (e.g. one or more phased locked loops (PLLs), delay locked loops (DLLs), clock dividers, clock multipliers, etc. The clock generator circuit 16 may generate the clock responsive to the reference clock (e.g. the frequency of the generated clock may be a multiple of the reference clock frequency). In the illustrated embodiment, a separate power supply $V_{dda}$ powers the clock generator circuit to reduce noise on the power supply of the clock generator circuit that may be caused by the logic circuitry 12, for example.

Figure 2:
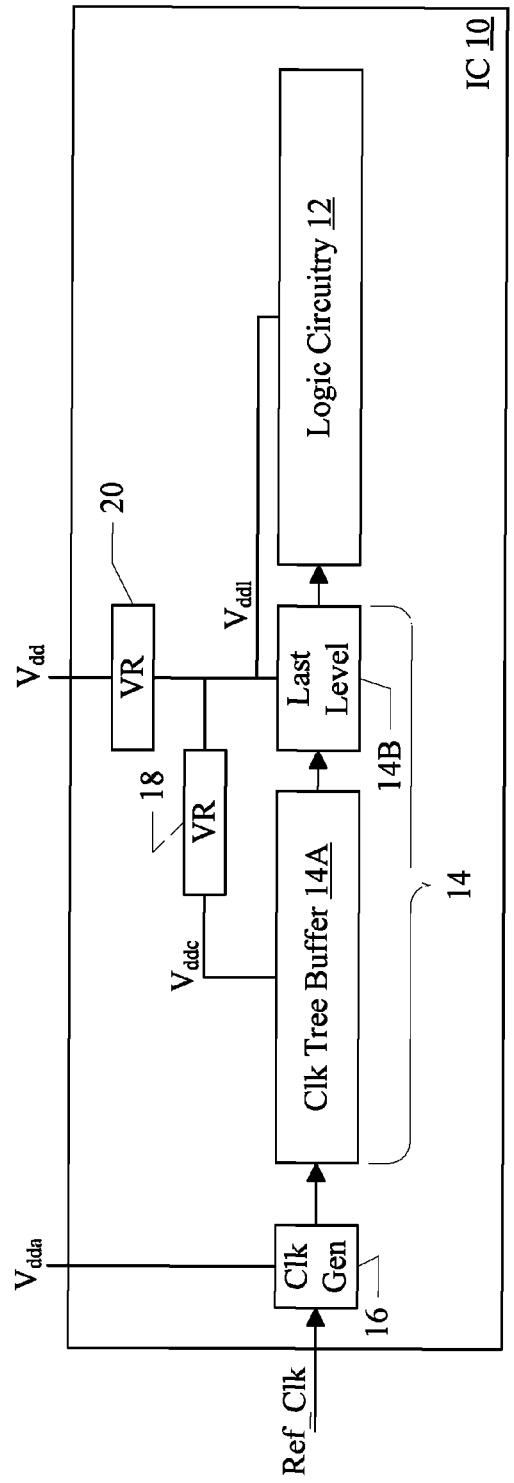
FIG. 2 is a block diagram of another embodiment of the integrated circuit.

FIG. 2 is a block diagram of another embodiment of the IC 10, including the logic circuitry 12, the clock tree circuit 14, the clock generator 16, and voltage regulator 18 similar to the embodiment of FIG. 1. In FIG. 2, a second voltage regulator 18 is included and receives an externally generated $V_{dd}$ supply voltage to generate the $V_{ddl}$ supply voltage for the voltage regulator 18, the last level circuit 14B, and the logic circuitry 12.

Figure 3:
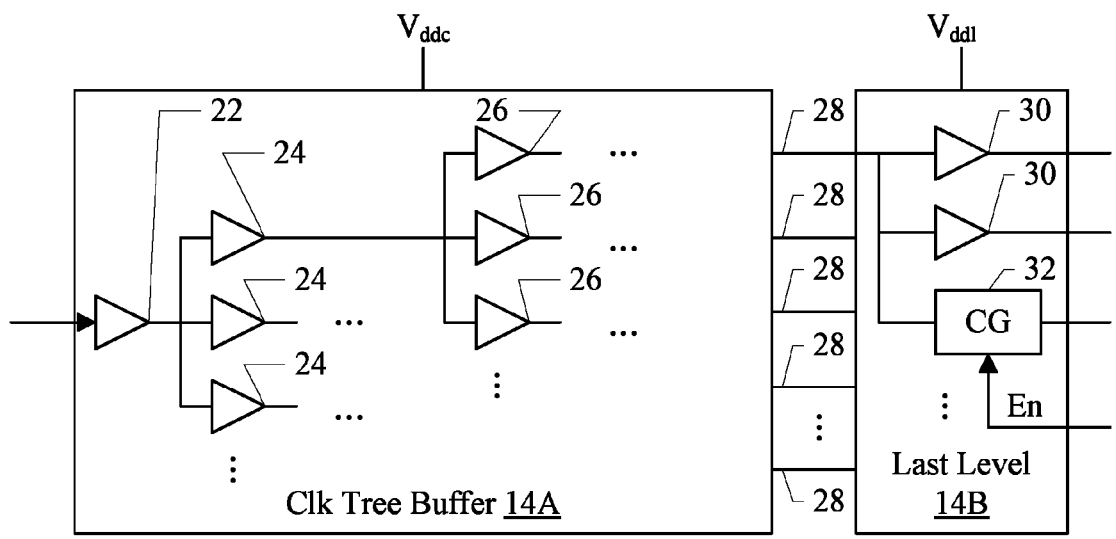
FIG. 3 is a logic diagram of one embodiment of components shown in FIGS. 1 and 2.

FIG. 3 is a block diagram illustrating the clock tree buffer circuit 14B and the last level circuit 14B in greater detail for an embodiment. The clock tree buffer circuit 14A is supplied by the $V_{ddc}$ supply voltage, and the last level circuit 14B is supplied by the $V_{ddl}$ supply voltage.

The clock tree buffer circuit 14A includes multiple levels of buffering. The first level is coupled to the input clock from the clock generator circuit 16, and includes one or more buffers 22. Each buffer 22 may drive a load, e.g. the buffers 24 in FIG. 3. The number of buffers 24 that load each buffer 22 may be approximately the same, and the wire length and impedance between each buffer 22 and its load buffers 24 may be approximately the same to help minimize differences in delay which may lead to clock skew. Each buffer 24 may, in turn, drive a level of buffers 26, and the load on each buffer 24 and the interconnect to the buffers 26 may be approximately the same for each buffer 24. Any number of levels of buffer may be used, generating multiple clock outputs 28 to the last level circuit 14B. As mentioned previously, the various levels of the clock tree buffer circuit 14A may be distributed over the area occupied by the logic circuitry 12.

Each of the outputs 28 is coupled to a load in the last level circuit 14B. Similar to the above discussion, the load on each output 28 may be approximately the same as the load on each other output 28. The load may include one or more buffer/level shifter circuits that level shift the clock to the Vddl supply voltage, such as buffer/level shifter circuits 30. The load may also include one or more clock gater circuits 32. The clock gater circuits 32 may also integrate the level shifter to level shift the clock signal, while also gating the clock with the input enable (En in FIG. 3). The input enable may be generated by the logic circuitry 12 (e.g. by monitoring the activity in the logic circuitry 12 to detect which circuits are idle in a give clock cycle. If the enable is asserted, the toggling clock may be passed through the clock gater circuit 32. If the enable is deasserted, the clock may be gated (e.g. held in steady state at a level that may cause the receiving clocked storage devices to retain their current value). The level of the gated clock may be high or low in various embodiments.

Figure 4:
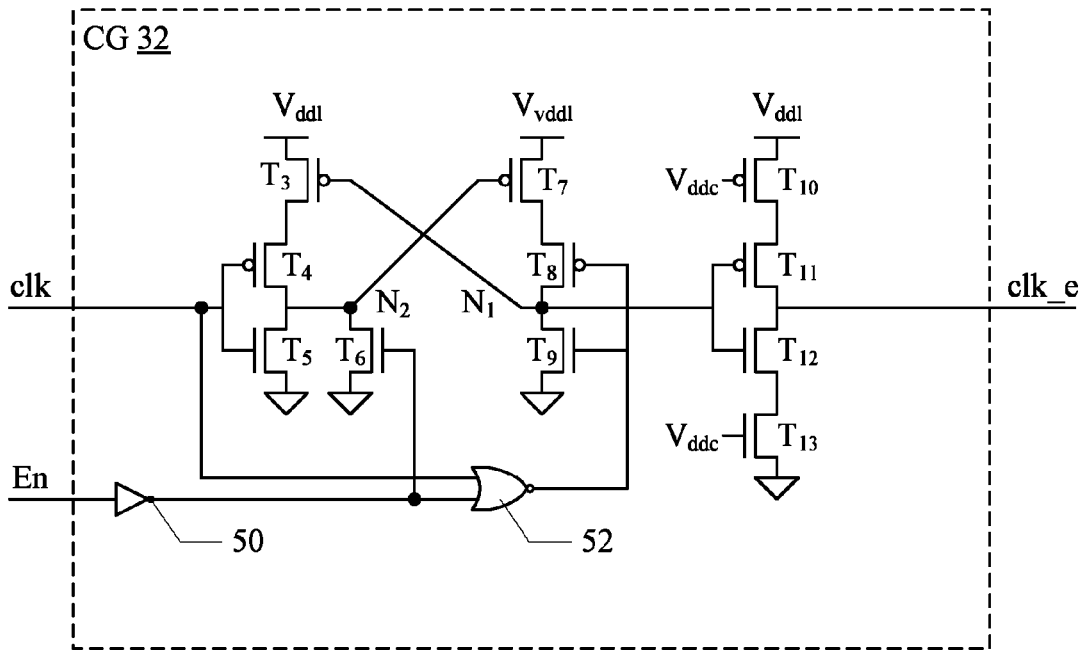
FIG. 4 is a circuit diagram of one embodiment of a combined clock gater/level shifter.

FIG. 4 is a circuit diagram of one embodiment of the clock gater 32. In the embodiment of FIG. 4, the clock gater 32 includes a shifting stage comprising transistors $T_3$-$T_9$ and an output inverter comprising transistors $T_{10}$-$T_{13}$. $T_3$ has a source coupled to the $V_{ddl}$ supply voltage, a gate coupled to a node N1, and a drain coupled to the source of $T_4$. The gates of $T_4$ and $T_5$ are coupled to the clk signal, and the drains of $T_4$, $T_5$, and $T_6$ are coupled to the node N2. The sources of $T_5$ and $T_6$ are coupled to ground. The gate of $T_6$ is coupled to an inversion of the En signal, output from the inverter 50. The output of the inverter 50 and the clk signal are inputs to a NOR gate 52, which has its output coupled to the gates of $T_8$ and $T_9$. The source of $T_9$ is coupled to ground. The drains of $T_8$ and $T_9$ are coupled to the node N1. The source of $T_8$ is coupled to the drain of $T_7$, which has its source coupled to the $V_{ddl}$ supply voltage. The gate of the transistor $T_7$ is coupled to the node N2. The node N1 is the output of the shift stage and supplies the input to the output inverter. The gates of $T_{11}$ and $T_{12}$ are coupled to the node N1, and the drains of $T_{11}$ and $T_{12}$ are coupled to the clk_e signal. The source of $T_{11}$ is coupled to the drain of $T_{10}$, which has its source coupled to the $V_{ddl}$ supply voltage and its gate coupled to the $V_{ddc}$ supply voltage. The source of $T_{12}$ is coupled to the drain of $T_{13}$, which has its source coupled to ground. The gate of $T_{13}$ is coupled to the $V_{ddc}$ supply voltage.

Operation of the shift stage will first be described. For simplicity, the En signal will be assumed asserted to indicate enabled (and thus $T_6$ is disabled and the NOR gate 52 passes the inversion of the clk signal). When clk transitions from low to high, $T_5$ is activated and begins discharging node N2. $T_4$ is also deactivated by the clk transition, isolating the node N2 from $T_3$. As the node N2 discharges, $T_7$ activates and begins charging node N1 to the $V_{ddl}$ supply voltage ($T_8$ is also activated, and $T_9$ is deactivated, by the transition to low on the output of the NOR gate 52 due to the transition high of the clk signal). Accordingly, N1 results in the same logical state as the clk signal, at the $V_{ddl}$ supply voltage. When clk transitions from high to low, the output of the NOR gate transitions from low to high and $T_9$ is activated. $T_9$ begins discharging the node N1. $T_8$ is also deactivated by the clk transition, isolating the node N1 from $T_7$. Thus, the node N1 is discharged to ground. As the node N1 discharges, $T_3$ activates and begins charging node N2 to the $V_{ddl}$ supply voltage ($T_4$ is also activated by the transition to low of clk), thus deactivating $T_7$.

$T_4$ and $T_8$ may limit power dissipation during transition, by isolating the nodes N2 and N1, respectively, from $T_3$ and $T_7$, respectively. $T_3$ and $T_7$ may be delayed in deactivating with respect to the activation of $T_5$ and $T_9$, respectively, since $T_3$ and $T_7$ are deactivated through the charging of nodes N1 and N2, respectively. By isolating $T_3$ and $T_7$ from their respective nodes N2 and N1 when $T_5$ and $T_9$ are activated, $T_3$ and $T_7$ may be prevented from fighting the discharge of their respective nodes N2 and N1. $T_4$ and $T_8$ are optional and may be deleted in other embodiments. In such embodiments, the drains of $T_3$ and $T_7$ may be coupled to the drains of $T_5$ and $T_9$, respectively.

In this embodiment, the clock gater 32 also provides clock gating functionality via the enable signal. If the enable signal is deasserted (low), $T_6$ is activated via the output of the inverter 50 and $T_8$ is activated via the output of the NOR gate 52. $T_6$ discharges node N2 (which activates $T_7$). $T_7$ and $T_8$ in series charge node N1. $T_3$ is deactivated as the node N1 is charged. Thus, the output node N1 may be held steady at the $V_{ddl}$ supply voltage if the enable signal is deasserted, independent of the state of the clk signal.

The output inverter provides output buffering, which may permit the transistors $T_3$-$T_9$ to be smaller. The output inverter is optional and may be eliminated in other embodiments. $T_{11}$ and $T_{12}$ provide the inversion. In the illustrated embodiment, the transistors $T_{10}$ and $T_{13}$ are provided to aid in matching the delay of other buffer circuits. These transistors are optional and may be eliminated in other embodiments. In such embodiments, the source of $T_{11}$ may be coupled to the $V_{ddl}$ supply voltage and the source of $T_{12}$ may be coupled to ground. Alternatively, only $T_{10}$ may be eliminated in other embodiments.

In some embodiments, the non-clock gated buffer circuits 30 may use the same circuit as that shown in FIG. 4 (or in FIG. 5 below) to attempt to match delays with the clock gater circuit 32. In other embodiments, a similar level shifter may be implemented but without the clock gating circuitry. In such embodiments, $T_6$ and the inverter 50 may be eliminated, and the NOR gate 52 may be replaced by an inverter having the clk signal as an input.

The embodiment of FIG. 4 provides an inversion of the clk to the clk_e signals. That is, the clk and clk_e signals may be approximately 180 degrees out of phase (where the delay through the clock gater 32 may account for the signals being somewhat less than 180 degrees out of phase). The embodiment of FIG. 5 is an example of a second embodiment of the clock gater circuit 32 that provides a clk_e approximately in phase with the clk signal (but lagging due to the delay of the clock gater 32).

Figure 5:
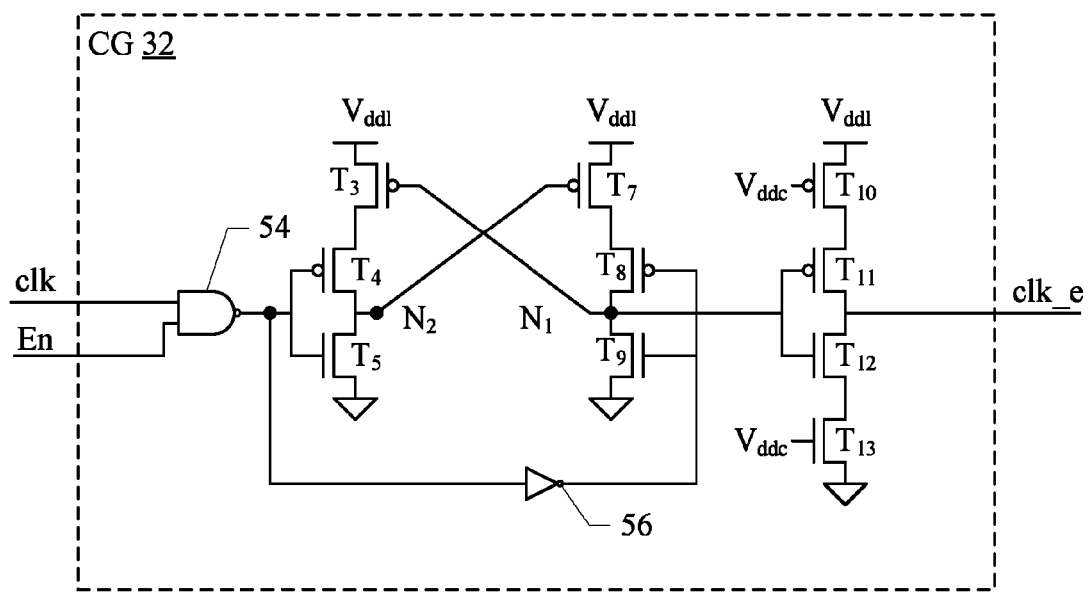
FIG. 5 is a circuit diagram of one embodiment of a combined clock gater/level shifter.

The embodiment of FIG. 5 includes a shift stage comprising $T_3$-$T_5$ and $T_7$-$T_9$ and an output inverter comprising $T_{10}$-$T_{13}$. $T_3$-$T_5$, $T_7$-$T_9$, and $T_{10}$-$T_{13}$ are coupled to each other and to the nodes N1 and N2 in a manner similar to the embodiment of FIG. 4. $T_3$-$T_5$, $T_7$-$T_9$, and $T_{10}$-$T_{13}$ operate similar to the description of FIG. 4 responsive to the high and low inputs on their gate terminals. Comments regarding portions that are optional may be similar to the description of FIG. 4 as well. However, the gates of $T_4$ and $T_5$ are coupled to receive an inversion of the clk signal, instead of the clk signal, when the En signal is asserted (through a NAND gate 54). The output of the NAND gate 54 is inverted via the inverter 56, the output of which is coupled to the gates of $T_8$ and $T_9$. Accordingly, the node N1 transitions low if the clk signal transitions high and the node N1 transitions high if the clk transitions low. The output clk_e is the inversion of the node N1, and thus is approximately in phase with the clk signal (lagging by the delay of the clock gater 32). If the enable signal is deasserted, the output of the NAND gate 54 is high and the output of the inverter 56 is low, thus holding the node N1 steady at the $V_{ddl}$ supply voltage (and the clk_e at the ground voltage) independent of the clk signal. Embodiments of the non-clock gated buffer 30 may replace the NAND gate 54 with an inverter (or may eliminate the NAND gate 54 and may couple the node N2 to the output inverter stage).

Figure 6:
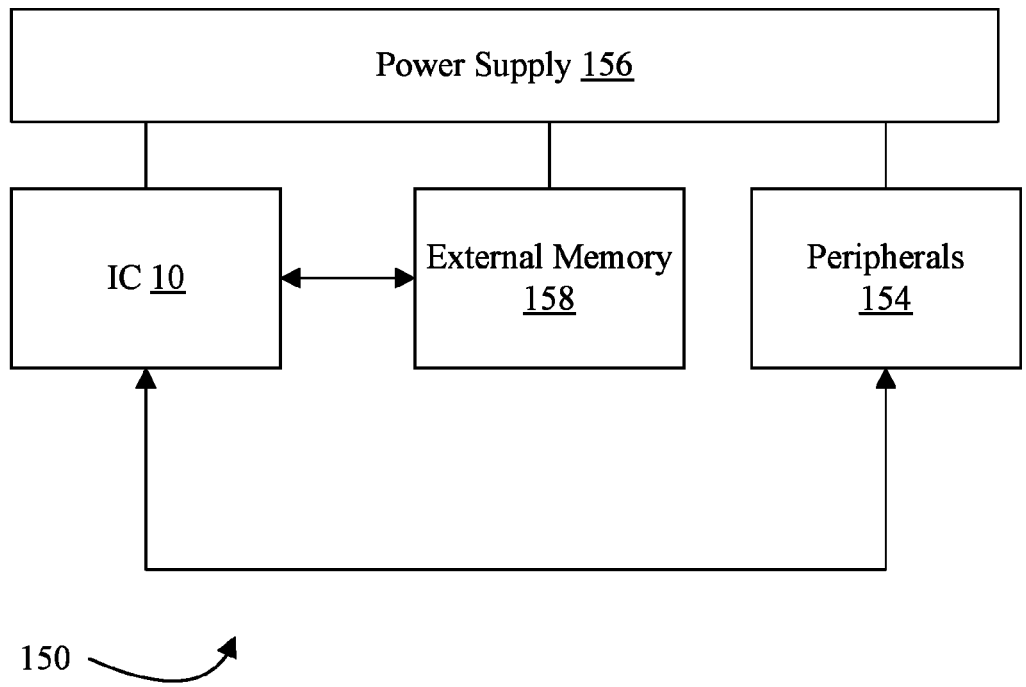
FIG. 6 is a block diagram of one embodiment of a system.

FIG. 6 is a block diagram of one embodiment of a system 150. In the illustrated embodiment, the system 150 includes at least one instance of the integrated circuit 10 coupled to one or more peripherals 154 and an external memory 158. A power supply 156 is provided which supplies the supply voltages to the IC 10 as well as one or more supply voltages to the memory 158 and/or the peripherals 154. Thus, for example, the power supply 156 may supply the $V_{dda}$ and $V_{ddl}$ voltages shown in FIG. 1 or the $V_{dda}$ and $V_{dd}$ voltages shown in FIG. 2. In some embodiments, more than one instance of the IC 10 may be included (and more than one memory 158 may be included as well). The IC 10 may include an instance of the IC 10 as illustrated in FIG. 1 or FIG. 2.

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, low power versions of the DDR DRAM (e.g. LPDDR, mDDR, etc.), etc. The external memory 158 may include one or more memory modules to which the memory devices are mounted, such as single inline memory modules (SIMMs), dual inline memory modules (DIMMs), etc. Alternatively, the external memory 158 may include one or more memory devices that are mounted on the IC 10 in a chip-on-chip or package-on-package implementation.

Figure 7:
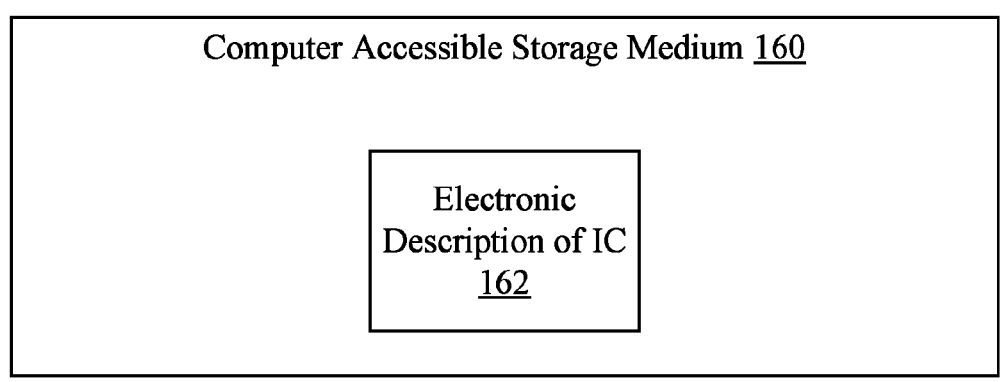
FIG. 7 is a block diagram of one embodiment of a computer accessible storage medium.

FIG. 7 is a block diagram of one embodiment of a computer accessible storage medium 160 storing an electronic description of the IC 10 (reference numeral 162) is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, or Flash memory. The storage media may be physically included within the computer to which the storage media provides instructions/data. Alternatively, the storage media may be connected to the computer. For example, the storage media may be connected to the computer over a network or wireless link, such as network attached storage. The storage media may be connected through a peripheral interface such as the Universal Serial Bus (USB). Generally, the computer accessible storage medium 160 may store data in a non-transitory manner, where non-transitory in this context may refer to not transmitting the instructions/data on a signal. For example, non-transitory storage may be volatile (and may lose the stored instructions/data in response to a power down) or non-volatile.

Generally, the electronic description 162 of the IC 10 stored on the computer accessible storage medium 160 may be a database which can be read by a program and used, directly or indirectly, to fabricate the hardware comprising the IC 10. For example, the description may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the IC 10. The netlist may then be placed and routed to produce a data set describing geometric shapes to be applied to masks. The masks may then be used in various semiconductor fabrication steps to produce a semiconductor circuit or circuits corresponding to the IC 10. Alternatively, the description 162 on the computer accessible storage medium 300 may be the netlist (with or without the synthesis library) or the data set, as desired.

While the computer accessible storage medium 160 stores a description 162 of the IC 10, other embodiments may store a description 162 of any portion of the IC 10, as desired.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   a logic circuit powered by a first power supply voltage having a first magnitude during use;
   a clock tree circuit coupled to the logic circuit and configured to distribute a clock to the logic circuit, wherein at least a portion of the clock tree circuit is powered by a second power supply voltage having a second magnitude during use; and
   a voltage regulator coupled to the first power supply voltage and configured to generate the second power supply voltage from the first power supply voltage, wherein the second magnitude is less than the first magnitude by a predetermined amount, and wherein the first magnitude changes dynamically during use and the voltage regulator is configured to track the first magnitude with the second magnitude at the predetermined amount less than the first magnitude.

2. The integrated circuit as recited in claim 1 wherein the predetermined amount is a fixed percentage.

3. The integrated circuit as recited in claim 1 wherein the predetermined amount is a fixed voltage offset.

4. The integrated circuit as recited in claim 1 further comprising a second voltage regulator configured to generate the first power supply voltage responsive to a third supply voltage that is input to the integrated circuit.

5. The integrated circuit as recited in claim 1 wherein the clock tree circuit comprises a plurality of levels of buffering including a last level that is connected to the logic circuit, and wherein the last level is powered by the first power supply voltage and one or more other levels of the plurality of levels are powered by the second power supply voltage.

6. The integrated circuit as recited in claim 5 wherein the last level comprises one or more clock gater circuits that combine a level shifter with clocking gating circuitry.

7. The integrated circuit as recited in claim 5 wherein the last level comprises one or more level-shifting buffer circuits.

8. The integrated circuit as recited in claim 1 wherein the first voltage dynamic changes comprise transient noise-induced changes.

9. The integrated circuit as recited in claim 1 wherein the first voltage dynamic changes comprise intentional changes to the first magnitude.

10. A system comprising:
    a power management unit configured to supply one or more power supply voltages to an integrated circuit; and
    the integrated circuit coupled to the power management unit, wherein the integrated circuit comprises a voltage regulator coupled to a first power supply voltage and configured to generate a second power supply voltage that supplies at least a portion of a clock tree circuit in the integrated circuit, wherein the first power supply voltage has a first magnitude that is greater than a second magnitude of the second power supply voltage, and wherein the first power supply voltage powers a plurality of sinks of the clock tree circuit, and wherein the first magnitude changes dynamically during use and the voltage regulator is configured to track the first magnitude with the second magnitude in a fixed relationship to the first magnitude.

11. The system as recited in claim 10 wherein the first power supply voltage is one of the one or more power supply voltages received by the integrated circuit from the power management unit.

12. The system as recited in claim 11 wherein the integrated circuit further comprises a second voltage regulator configured to generate the first power supply voltage responsive to one of the one or more power supply voltages received by the integrated circuit from the power management unit.

13. The system as recited in claim 10 wherein the fixed relationship is a fixed percentage.

14. The system as recited in claim 10 wherein the fixed relationship is a fixed difference.

15. The system as recited in claim 10 wherein the clock tree circuit comprises a plurality of levels of buffering from a clock source to the plurality of sinks, and wherein a last level of the plurality of levels before the plurality of sinks is powered by the first power supply voltage.

16. The system as recited in claim 15 wherein one or more other levels of the plurality of levels are included in the portion that is powered by the second power supply voltage.

17. The system as recited in claim 15 wherein the last level comprises level shifters.

18. The system as recited in claim 17 wherein the level shifters include combined clock gate/level shifter circuits.

19. A non-transitory computer accessible storage medium storing a data structure which is operated upon by a program executable on a computer system, the program operating on the data structure to perform a portion of a process to fabricate an integrated circuit including circuitry described by the data structure, the circuitry described in the data structure including:
- a logic circuit powered by a first power supply voltage having a first magnitude during use;
- a clock tree circuit coupled to the logic circuit and configured to distribute a clock to the logic circuit, wherein at least a portion of the clock tree circuit is powered by a second power supply voltage having a second magnitude during use; and
- a voltage regulator coupled to the first power supply voltage, and configured to generate the second power supply voltage from the first power supply voltage, wherein the second magnitude is less than the first magnitude by a predetermined amount, and wherein the first magnitude changes dynamically during use and the voltage regulator is configured to track the first magnitude with the second magnitude at the predetermined amount less than the first magnitude.

20. The non-transitory computer accessible storage medium as recited in claim 19 wherein the clock tree circuit comprises a plurality of levels of buffering including a last level that is connected to the logic circuit, and wherein the last level is powered by the first power supply voltage and one or more other levels of the plurality of levels are powered by the second power supply voltage, and wherein the last level comprises one or more clock gater circuits that combine a level shifter with clocking gating circuitry.

* * * * *